United States Patent
Nitschke

(10) Patent No.: US 7,995,313 B2
(45) Date of Patent: Aug. 9, 2011

(54) METHOD FOR OPERATING A PLASMA PROCESS AND ARC DISCHARGE DETECTION DEVICE

(75) Inventor: Moritz Nitschke, Freiburg (DE)

(73) Assignee: Huettinger Elektronik GmbH + Co. KG, Freiburg (DE)

( * ) Notice: Subject to any disclaimer, the term of this patent is extended or adjusted under 35 U.S.C. 154(b) by 928 days.

(21) Appl. No.: 11/944,556

(22) Filed: Nov. 23, 2007

(65) Prior Publication Data

US 2008/0121517 A1    May 29, 2008

Related U.S. Application Data

(60) Provisional application No. 60/861,115, filed on Nov. 27, 2006.

(30) Foreign Application Priority Data

Nov. 23, 2006 (EP) .................................. 06024306

(51) Int. Cl.
*H02H 3/00* (2006.01)
*H02H 9/08* (2006.01)

(52) U.S. Cl. ........................................................ 361/42
(58) Field of Classification Search ................ 361/42
See application file for complete search history.

(56) References Cited

U.S. PATENT DOCUMENTS

| | | | |
|---|---|---|---|
| 4,031,464 A | 6/1977 | Norberg | |
| 4,396,478 A | 8/1983 | Aizenshtein et al. | |
| 4,588,952 A | 5/1986 | Matsuoka | |
| 4,625,283 A | 11/1986 | Hurley | |
| 4,694,402 A | 9/1987 | McEachern et al. | |
| 4,936,960 A | 6/1990 | Siefkes et al. | |
| 5,192,894 A | 3/1993 | Teschner | |
| 5,241,152 A | 8/1993 | Anderson et al. | |
| 5,543,689 A | 8/1996 | Ohta et al. | |

(Continued)

FOREIGN PATENT DOCUMENTS

DE          4127504         2/1993

(Continued)

OTHER PUBLICATIONS

Zlatanovic et al., "Glow-to-Arc Transition Instability Sensor in Processing Plasma", Proc. $10^{th}$ International Conference on Microelectronics, MIEL'95, vol. 2, Serbia, Sep. 1995, pp. 597-600.

(Continued)

*Primary Examiner* — Ronald W Leja
(74) *Attorney, Agent, or Firm* — Fish & Richardson P.C.

(57) ABSTRACT

An arc discharge in a plasma process is detected using a method that includes detecting arc discharges by monitoring one or more characteristic values of the plasma process, and comparing at least a first characteristic value with a predefinable first threshold value ($SW_1$). When it is determined that the at least first characteristic value reaches the first threshold value, a potential arc discharge is recognized and a first countermeasure is triggered to suppress the arc discharge. The method includes comparing at least a second characteristic value with a pre-definable second threshold value ($SW_2$) that differs from the first threshold value, and when it is determined that the second characteristic value reaches the second threshold value, triggering a second countermeasure for suppressing the arc discharge. After the second countermeasure has been triggered, a renewed triggering of the second countermeasure is prevented during a blocking time (Tt).

45 Claims, 5 Drawing Sheets

U.S. PATENT DOCUMENTS

| | | | |
|---|---|---|---|
| 5,576,939 | A | 11/1996 | Drummond |
| 5,611,899 | A | 3/1997 | Maass |
| 5,698,082 | A | 12/1997 | Teschner et al. |
| 5,718,813 | A | 2/1998 | Drummond et al. |
| 5,729,145 | A | 3/1998 | Blades |
| 5,804,975 | A | 9/1998 | Alers et al. |
| 5,889,391 | A | 3/1999 | Coleman |
| 5,993,615 | A | 11/1999 | Abry et al. |
| 6,007,879 | A | 12/1999 | Scholl |
| 6,060,837 | A | 5/2000 | Richardson et al. |
| 6,063,245 | A | 5/2000 | Frach et al. |
| 6,162,332 | A | 12/2000 | Chiu |
| 6,213,050 | B1 | 4/2001 | Liu et al. |
| 6,332,961 | B1 | 12/2001 | Johnson et al. |
| 6,416,638 | B1 | 7/2002 | Kuriyama et al. |
| 6,420,863 | B1 | 7/2002 | Milde et al. |
| 6,472,822 | B1 | 10/2002 | Chen et al. |
| 6,535,785 | B2 | 3/2003 | Johnson et al. |
| 6,545,420 | B1 | 4/2003 | Collins et al. |
| 6,621,674 | B1 | 9/2003 | Zahringer et al. |
| 6,633,017 | B1 | 10/2003 | Drummond et al. |
| 6,736,944 | B2 | 5/2004 | Buda |
| 6,740,207 | B2 | 5/2004 | Kloeppel et al. |
| 6,753,499 | B1 | 6/2004 | Yasaka et al. |
| 6,783,795 | B2 | 8/2004 | Inoue et al. |
| 6,791,274 | B1 | 9/2004 | Hauer et al. |
| 6,859,042 | B2 | 2/2005 | Parker |
| 6,878,248 | B2 | 4/2005 | Signer et al. |
| 6,943,317 | B1 | 9/2005 | Ilic et al. |
| 6,967,305 | B2 | 11/2005 | Sellers |
| 7,016,172 | B2 | 3/2006 | Escoda |
| 7,081,598 | B2 | 7/2006 | Ilic et al. |
| 7,262,606 | B2 | 8/2007 | Axenbeck et al. |
| 7,301,286 | B2 | 11/2007 | Kuriyama |
| 7,408,750 | B2 | 8/2008 | Pellon et al. |
| 2004/0031699 | A1 | 2/2004 | Shoji |
| 2004/0079733 | A1 | 4/2004 | Kawaguchi et al. |
| 2004/0182697 | A1 | 9/2004 | Buda |
| 2004/0212312 | A1 | 10/2004 | Chistyakov |
| 2005/0051270 | A1 | 3/2005 | Sasaki et al. |
| 2005/0093459 | A1 | 5/2005 | Kishinevsky |
| 2005/0135025 | A1 | 6/2005 | Escoda |
| 2006/0011473 | A1 | 1/2006 | Kuriyama et al. |
| 2006/0054601 | A1 | 3/2006 | Ilic et al. |
| 2006/0100824 | A1 | 5/2006 | Moriya |
| 2006/0181816 | A1 | 8/2006 | Pellon et al. |
| 2006/0213761 | A1 | 9/2006 | Axenbeck et al. |
| 2006/0241879 | A1* | 10/2006 | van Zyl .................. 702/60 |
| 2007/0073498 | A1 | 3/2007 | Winterhalter et al. |
| 2007/0121267 | A1 | 5/2007 | Kotani et al. |
| 2007/0168143 | A1 | 7/2007 | Axenbeck et al. |
| 2007/0251813 | A1 | 11/2007 | Ilic et al. |
| 2008/0121625 | A1 | 5/2008 | Zaehringer |
| 2008/0122369 | A1 | 5/2008 | Nitschke |
| 2008/0133154 | A1 | 6/2008 | Krauss |
| 2008/0216745 | A1 | 9/2008 | Wiedemuth et al. |
| 2008/0218923 | A1 | 9/2008 | Wiedemuth |
| 2008/0257869 | A1 | 10/2008 | Nitschke et al. |

FOREIGN PATENT DOCUMENTS

| | | |
|---|---|---|
| DE | 43 26 100 | 2/1995 |
| DE | 44 20 951 | 12/1995 |
| DE | 19651615 | 7/1997 |
| DE | 19848636 | 5/2000 |
| DE | 10034895 | 2/2002 |
| DE | 10119058 | 10/2002 |
| DE | 102004015090 | 11/2005 |
| DE | 102006002333 | 7/2007 |
| EP | 0713242 | 5/1996 |
| EP | 0 967 697 | 12/1999 |
| EP | 1 121 705 | 8/2001 |
| EP | 0 692 138 | 1/2004 |
| EP | 1 441 576 | 7/2004 |
| EP | 1705687 | 9/2006 |
| EP | 1720195 | 11/2006 |
| JP | 06132095 | 5/1994 |
| JP | 08-167500 | 6/1996 |
| JP | 08222398 | 8/1996 |
| JP | 09170079 | 6/1997 |
| JP | 2000117146 | 4/2000 |
| JP | 2005077248 | 3/2005 |
| WO | WO 94/25977 | 11/1994 |
| WO | WO 01/13402 | 2/2001 |
| WO | WO 03/037047 | 5/2003 |
| WO | WO 03/088445 | 10/2003 |
| WO | WO 2006/014212 | 2/2006 |
| WO | W02006116445 | 11/2006 |

OTHER PUBLICATIONS

Search Report from corresponding European Application No. 06024306.0, mailed Apr. 23, 2007, 8 pages.

Ochs et al., "Advanced Power Supplies designed for Plasma Deposition and Etching", Vakuum in Forschung und Praxis, vol. 8, No. 5, Sep. 26, 2006, pp. 32-36.

Van Zyl et al., "Managing Arcs in RF Powered Plasma Processes", Society of Vacuum Coaters, 48th Annual Technical Conference Proceedings, 2005, pp. 44-49.

Zlatanovic et al., "Glow-to-Arc Transition Instability Sensor in Processing Plasma", Proc. 20th International Conference on Microelectronics, vol. 2, Sep. 12-14, 1995, pp. 597-600.

Translation of Office Action from correspondence Japanese Application No. 2007-504279, dated Sep. 28, 2009, 4 pages.

\* cited by examiner

METHOD FOR OPERATING A PLASMA PROCESS AND ARC DISCHARGE DETECTION DEVICE

CROSS REFERENCE TO RELATED APPLICATIONS

This application claims priority under 35 U.S.C. §119(a) to European Application No. 06 024 306.0, filed on Nov. 23, 2006, and under 35 U.S.C. §119(e) from U.S. Provisional Application No. 60/861,115, filed on Nov. 27, 2006. Both of these priority applications are hereby incorporated by reference in their entirety.

TECHNICAL FIELD

The present invention relates to a method for detection of an arc discharge in a plasma process in which arc discharges are detected and to an arc discharge detection device for detection of arc discharges in a plasma process.

BACKGROUND

Plasma processes occur, for example, in plasma processing and coating devices. Some of the devices of this type are also designated in general terms as sputtering systems on account of the sputtering process used. In DC sputtering systems, flashovers, which are also called arcs, are a frequent occurrence. In a flashover, a current seeks an electrically conducting channel in the plasma. Such flashovers can occur relatively frequently, for example, during reactive coating of a substrate. A flashover is caused by the fact that in addition to the substrate itself, parts of the sputtering system, such as the inner wall of the process chamber, are coated with electrically non-conducting or only poorly conducting materials, which then become charged up to a breakdown voltage. To avoid major damage to the sputtering systems, the current supply of a plasma DC supply is switched off or briefly interrupted or a voltage at the plasma chamber is short-circuited or the polarity is reversed as soon as possible during the formation of a flashover. To be able to initiate the aforesaid measures at all, devices for arc discharge detection (arc detection) as well as for suppressing or extinguishing arc discharges (arcs) can be part of the plasma current supply or plasma DC voltage supply.

An arc discharge can be recognized, for example, by a voltage dip or a voltage drop or by a current rise at the output of the plasma DC voltage supply. In other words, an arc discharge can be recognized by monitoring at least one corresponding characteristic value of the plasma process, where the characteristic value can be one of the aforesaid electrical characteristics.

Generic methods and devices for this purpose are known, for example, from WO 2006/014212 A2, EP 1 121 705 A1, DE 10 2004 015090 A1, and EP 0 692 138 B1, in which an arc discharge is recognized by monitoring one of the aforesaid electrical characteristics of the plasma process and a corresponding countermeasure is introduced.

WO 2006/014212 A2 indicates that in plasma processes, different types, manifestations, or intensities of arc discharges can play a part. In addition to so-called "hard arcs," which can result in damage to the sputtering system and defects in a substrate to be processed, so-called "short arcs" (which are arcs that are relatively strongly defined but self-extinguishing in contrast to hard arcs) and so-called "micro arcs" (hereinafter also designated as micro arc discharges) are known in particular. Micro arc discharges can extinguish themselves before being recognized. However, micro arc discharges can become amplified and can then lead to a serious short arc or hard arc.

In this connection, WO 2006/014212 A2 proposes that when a micro arc is detected, the arc discharge should be extinguished by means of a shunt switching element that interrupts a plasma DC voltage supply. After a relatively short time, the plasma DC voltage supply is switched on again and it is checked whether the arc discharge can still be detected. Should this be the case, the presence of a hard arc is assumed and the switching element remains switched on again for a (longer) duration.

SUMMARY

In one general aspect, an arc discharge in a plasma process is detected using a method that includes detecting arc discharges by monitoring one or more characteristic values of the plasma process, and comparing at least a first characteristic value with a predefinable first threshold value ($SW_1$). When it is determined that the at least first characteristic value reaches the first threshold value, a potential arc discharge is recognized and a first countermeasure is triggered to suppress the arc discharge. The method includes comparing at least a second characteristic value with a pre-definable second threshold value ($SW_2$) that differs from the first threshold value, and when it is determined that the second characteristic value reaches the second threshold value, triggering a second countermeasure for suppressing the arc discharge. After the second countermeasure has been triggered, a renewed triggering of the second countermeasure is prevented during a blocking time (Tt).

Implementations can include one or more of the following features. For example, the second threshold value can be reached before the first threshold value is reached when the second characteristic value deviates from a discharge-free operating value.

The method can include setting the blocking time (Tt) or automatically setting the blocking time (Tt). The method can include automatically varying the blocking time (Tt) depending on a number of micro arc discharges that have occurred.

One or more characteristic values can be compared with more than two threshold values, and when the respective threshold values are exceeded, different and respective countermeasures are taken.

The first countermeasure can be triggered by interrupting a plasma voltage supply or reversing the polarity of the plasma voltage supply during a first time that can be set. The second countermeasure can be triggered by interrupting a plasma voltage supply or reversing the polarity of the plasma voltage supply during a second time ($tAS2$) that can be set.

The second time ($tAS_2$) can be shorter than the first time ($tAS_1$). The second time $tAS_2$ can be greater than or equal to a time $t_0$ and less than or equal to 20 µs, where the time to is less than or equal to 1 µs.

The blocking time (Tt) can be longer than the first time ($tAS_1$) or the second time ($tAS_2$).

The second countermeasure can be triggered immediately on reaching the second threshold value ($SW_2$). The first countermeasure can be triggered after an adjustable first delay time ($t_1$) after reaching the first threshold value ($SW_1$).

When the second threshold value ($SW_2$) is reached, there can be no comparison with the first threshold value or the result of the comparison can be ignored for a predefinable time.

The method can include, after an adjustable delay time ($t_1$) after reaching the first threshold value ($SW_2$), determining whether the first threshold value ($SW_1$) is still reached, and triggering the first countermeasure only if the first threshold value $SW_1$ is still reached.

The second countermeasure can be triggered after an adjustable second delay time ($t_2$) after reaching the second threshold value ($SW_2$).

The blocking time (Tt) can be set at a value between a first value and a second value of the order of magnitude of several microseconds or milliseconds. The blocking time can be greater than or equal to 0. The blocking time (Tt) can be set to a value that is larger than the duration of the second countermeasure.

The one or more characteristic values of the plasma process can be monitored by monitoring at least one characteristic value upstream of, in, or downstream of an impedance matching network.

The second characteristic value can equal the first characteristic value. Or, the second characteristic value can be distinct from (that is, not equal to) the first characteristic value.

The second characteristic value can be compared with the pre-definable second threshold value by comparing an instantaneous value of the second characteristic value with a value determined from the second characteristic value within a predetermined time period, where an extreme value of the second characteristic value in the predetermined time period is determined as the second threshold value ($SW_2$) and arc discharge is detected based on the comparison.

The arc discharge can be detected when the comparison shows that the deviation of the instantaneous value or a value proportional thereto from the extreme value exceeds a pre-definable deviation.

The arc discharge can be detected when the instantaneous value or the value proportional thereto reach a reference value that can be determined from the predefinable deviation.

One or more threshold values can be configured to be adjusted by a user or to be set automatically.

The method can include detecting the frequency of reaching one or more threshold values.

In another general aspect, an arc discharge detection device is configured to detect arc discharges in a plasma process. The device includes a comparator having a first comparison means for comparing a first characteristic value of the plasma process with a pre-definable first threshold value ($SW_1$). On reaching the first threshold value, the first comparison means triggers a first countermeasure for suppressing the arc discharge by activating a first control signal ($AS_1$). The comparator includes a second comparison means for comparing a second characteristic value with a predefinable second threshold value ($SW_2$). The second threshold value differs from the first threshold value and, on reaching the second threshold value, the second comparison means triggers a second countermeasure for arc discharge suppression by activating a second control signal ($AS_2$), and the comparator includes a blocking control unit that blocks renewed activation of the second control signal during a blocking time (Tt) after activation of the second control signal.

Implementations can include one or more of the following features. For example, the second characteristic value can equal the first characteristic value. The second threshold value can be reached first when the characteristic value deviates from a discharge-free operating value.

The second characteristic value can be distinct from (that is, not equal to) the first characteristic value. The second threshold value can be reached first when the second characteristic value deviates from a discharge-free operating value.

The comparator can be configured to compare one or more of an output voltage, an output current, electric or magnetic fields, and temporal changes of physical quantities of a plasma voltage supply with the first and second threshold values ($SW_1$, $SW_2$).

The first and second threshold values can be threshold voltages, threshold currents, or threshold fields or values representative of changes of physical quantities.

One or more of the countermeasures can include switching off or reversing a polarity of a plasma voltage supply according to the first and/or second control signal ($AS_1$, $AS_2$) or switching off a plasma voltage supply.

The first and/or the second countermeasure can be triggered after corresponding adjustable delay times ($t_1$, $t_2$) for the first control signal ($AS_1$) or for the second control signal ($AS_2$).

For a respective time duration of the first and second countermeasures ($tAS_1$, $tAS_2$) the time duration of the second countermeasure ($tAS_2$) can be shorter than the time duration of the first countermeasure ($tAS_1$).

The time duration of the second countermeasure ($tAS_2$) can be less than about one microsecond and up to about 20 µs.

The blocking time (Tt) can be freely adjustable. The blocking time (Tt) can be set automatically. The blocking time (Tt) can be varied automatically depending on a number of micro arc discharges that have occurred. The blocking time (Tt) can be between about zero and about several microseconds or milliseconds.

The arc discharge detection device can be designed at least with regard to the comparison of the second characteristic value in relation to the second threshold value ($SW_2$) for automatic detection of an arc discharge as an arc discharge detection device for detecting arc discharges in a plasma process, to which a second characteristic value is supplied and which includes a comparator that emits an arc discharge detection signal, where the second characteristic value is supplied to an extreme value detection device for detecting an extreme value of the second characteristic value as a second threshold value in a predefined time period, where an adjusting means generates a reference signal from the extreme value, which is supplied to the comparator as well as an instantaneous value of the second characteristic value or of a proportional signal, where the comparator changes the signal level of the arc discharge detection signal when the comparator detects that the instantaneous value has reached the reference signal.

An arc discharge detection device and corresponding method are designed to detect micro arc discharges of a plasma process without the processing rate being adversely affected.

This object is achieved in a method of the type specified initially in that the at least one first characteristic value and/or at least one second characteristic value is/are compared with a pre-definable second threshold value ($SW_2$), which differs from the first threshold value, and when the second threshold value is reached, a second countermeasure is triggered for suppressing the arc discharge, and after the second countermeasure has been triggered, a renewed triggering of the second countermeasure is prevented during a blocking time (Tt).

In a method variant, the second threshold value can be reached first when the characteristic value(s) deviate(s) from a typical arc discharge-free operating value.

In an arc discharge detection device of the type specified initially, the object is achieved whereby the comparator further has a second comparison means for comparing the first characteristic value and/or a second characteristic value with a predefinable second threshold value, wherein the second threshold value differs from the first threshold value and wherein, when the second threshold value is reached, the second comparison means can trigger a second countermeasure to suppress the arc discharge by activating a second control signal, and whereby the comparator has a blocking control unit that blocks a renewed activation of the second control signal during a blocking time (Tt) after the second control signal has been activated.

In one embodiment of the arc discharge detection device, the second threshold value can be reached before the first threshold when the characteristic value(s) deviate(s) from a typical arc discharge-free operating value.

Thus, at least two thresholds are provided for detection of an arc discharge, where the second threshold recognizes micro arc discharges and can optionally respond to this immediately with a short pulse but can then only be triggered again after a time which can be set. This can apply even if further micro arc discharges are detected during this time. The first threshold is used in a manner known per se to detect short arcs and hard arcs. It has been shown that the occurrence of short arcs and hard arcs can be reduced significantly with such an arrangement without having a negative effect on the plasma treatment rate.

If a response were to be made directly to each micro arc discharge without observing a blocking time, this could have the result that the processing rate is very low. To prevent or reduce this problem, the threshold is often set as correspondingly insensitive which in return has the result however that many micro arc discharges are not detected. However, if a correspondingly high number of arc discharges is not detected, the probability of the occurrence of a short arc or hard arc increases. However, short and hard arcs are extremely disadvantageous for the result of the plasma processing. It is therefore advantageous to reduce the rate of short and hard arcs by also detecting micro arc discharges that only cause a very small change in the supply line signals (current and voltage), which can serve as (electrical) characteristic values for input into the arc discharge detection device.

It is not necessary to respond to any of these micro arc discharges in this case, but rather it is advantageous to observe the aforementioned blocking time. The term "blocking time" should be interpreted very broadly in this connection. The blocking time can alternatively also be set at a fixedly pre-defined blocking time, e.g., depending on a rate of detected micro arc discharges or a rate of detected short or hard arcs. Alternatively, the blocking time can be variable depending on a signal at a particular input pin on the plasma current supply to be incorporated by the user in an automatic dependence of its measurements or controls, e.g., relating to a prevailing gas pressure or a gas mixture used.

Finally, the blocking time can also be variable in a form such that the blocking time always elapses after a specific, predefined or pre-definable number of detected micro arc discharges. A value of 50 to 1000 micro arc discharges is advantageous, for example, 100, 250, 500, 750 micro arc discharges can be advantageous. As has been mentioned, this number can also be firmly preset by the user or it can be automatically coupled to the arc rate of micro arc discharges, short and/or hard arcs and optionally incorporated by the user in an automatic controller.

Additionally or alternatively to automatic setting of the blocking time, the user can be allowed to pre-select a maximum blocking time that is not exceeded even if the automatic blocking time setting would provide a longer duration. In addition, a minimum blocking time can be pre-selected below which the blocking time does not go even if the automatic blocking time would provide a shorter duration.

Further embodiments can additionally provide to define further thresholds or threshold values for detecting submicro arcs to which a similar response can be made as to the micro arc discharges described where the further blocking time for these submicro arcs can be set independently of the micro arc discharges. Submicro arcs can be shorter in duration and smaller in magnitude than micro arcs.

It is possible to compare one or more characteristic values with more than two threshold values, and when the threshold values are exceeded, different measures can be taken. It is thereby feasible to compare one characteristic value with more than two threshold values. It is moreover also feasible to compare different characteristic values with different threshold values. Different measures can be taken to react to different comparisons. Possible measures include, in particular, to switch on/off a current supply, delay supply signals, for example, radio frequency (RF) signals, switch over switching elements, reverse the polarity of the supply voltage, or count the occurrence of arcs. It is also feasible to supply the result of the comparison to neural networks or a fuzzy logic, and the neural networks or fuzzy logic decide which measure to initiate. The blocking time can be selected to be longer than the first time or second time, thereby preventing premature switching off of a current supply. This ensures, in particular, that more power is supplied to the plasma chamber compared to conventional methods.

The blocking time of an arc discharge detection device can be correspondingly adjusted to be longer than the first time or the second time.

Depending on whether the characteristic value considered is a voltage or a current, the first and second threshold values are embodied either as threshold voltages or voltage thresholds or current thresholds. In this case, the term "reaching" a threshold value used for the description of the present invention should be understood in such a manner that in the course of the comparison it is established that the monitored (electrical) characteristic value has a value substantially corresponding to the threshold value or that the characteristic value falls below the respective threshold value (if the monitored characteristic value is the voltage of the plasma process) or exceeds said threshold value if the monitored characteristic value is the current of the plasma process.

The comparator can be designed to compare an output voltage and/or an output current of a plasma voltage supply with the first and second threshold values in the form of threshold voltages or threshold currents.

As a first countermeasure, a plasma voltage supply can be interrupted or the polarity can be reversed during an adjustable first time. In this way, an existing or an incipient arc discharge can be efficiently counteracted.

As a second countermeasure, a plasma voltage supply can be interrupted or the polarity can be reversed during an adjustable second time. In this way, a detected micro arc discharge can be counteracted just as efficiently.

As a first or a second countermeasure, a plasma voltage supply can be interrupted or the polarity can be reversed several times in a so called "pulse burst mode" during an adjustable time, respectively.

For the arc discharge detection device described herein, it is correspondingly provided that a plasma voltage supply can be switched off or the polarity can be reversed according to the first and/or second control signal.

In another further development of the method, it is additionally provided that the second time is shorter than the first time. In this case, it is provided in particular that for the second time $tAS_2$ it holds that $t_0 \leq tAS_2 \leq 20$ µs where $t_0 \leq 1$ µs. Micro arc discharges can thus be successfully extinguished in most cases and the rate of short and hard arcs is effectively reduced.

For a respective time duration of the first and second countermeasures, the time duration of the second countermeasure can be shorter than the time duration of the first countermeasure, the time duration of the second countermeasure preferably being between less than one microsecond and up to 20 µs, for example, 1, 5, 10, or 15 µs.

To be able to respond flexibly to the occurrence of arc discharges depending on a respective plasma process, the first countermeasure can be triggered after an adjustable first delay time after reaching the first threshold value. Alternatively or additionally, the second countermeasure can be triggered after an adjustable delay time $t_2$ after reaching the second threshold value.

The first and/or second countermeasure can be triggered after corresponding adjustable delay times for the first control signal or for the second control signal.

In the case $t_2=0$, the second countermeasure can be triggered directly on reaching the second threshold value. In other words: it is possible to react faster to micro arc discharges than to short arcs or hard arcs, in particular, even immediately after detecting these ($t_2=0$) so that in this way, the rate of short arcs and hard arcs can be reduced.

The delay time $t_2$ can be fixedly predefined by the user or set automatically, e.g., depending on the rate of the detected micro arc discharges or on the rate of the detected short or hard arcs. Alternatively, the delay time can be variable depending on a signal at an input pin of the plasma current supply to be incorporated by the user in an automatic dependence of its measurements or controls. In addition to the automatic adjustability of the delay time, it is possible for the user to pre-select a maximum or minimum delay time that is not exceeded or fallen below even if the automatic setting would provide a longer or shorter duration for the delay time.

The delay time $t_2$ can be set automatically in the form that the countermeasure is triggered after the first, after the second, or after the $n^{th}$ reaching of the second threshold value $SW_2$. The number n can be set by a user, can be set automatically, or can be randomly selected.

Moreover, when the second threshold value is reached, there may be no comparison with the first threshold value for a predefinable time, or the result of the comparison is ignored. When the second threshold value is reached, a countermeasure is initiated. This can possibly result in that the first threshold value also being reached. For this reason, it is suitable to switch off detection of the first threshold value for the duration of the second countermeasure.

As an alternative, it is possible to check after an adjustable delay time after reaching the first threshold value, whether the first threshold value is still reached, and to trigger the first countermeasure only if this applies. When the first threshold value is still reached after the adjustable delay time, this is an indication that a hard-arc occurred. As a result, the first countermeasure can be initiated. It is also feasible to await a predefined number of micro arcs and initiate the first countermeasure to prevent a hard arc from being developed. It is clear, that for these method variants, one threshold value must be set more sensitive than the other.

For flexible adaptation of the reaction to detected micro arc discharges, the blocking time Tt can be set at a value between a first value $Tt \geqq 0$ and a second value of the order of magnitude of several microseconds or milliseconds.

The blocking time can be between zero and several microseconds or milliseconds.

The blocking time can be set to a value that is larger than the duration of the second countermeasure. The blocking time of an arc discharge detection device can be correspondingly adjusted.

The at least one characteristic value can be detected in or downstream of an impedance matching network. The location where a characteristic value is detected may depend, for example, on the type of characteristic value that is used. It is, e.g., feasible to detect as the characteristic value a current, a voltage, a voltage change with time, a current change with time, or also electric or magnetic fields. In particular, electric, optical, acoustical measurements or a combination of these are possible. Moreover, a physical value can be measured as a characteristic value in a line or using an antenna in the plasma chamber.

Correspondingly, an arc discharge detection device can have measuring means in, upstream, or downstream of an impedance adjustment network. Moreover, sensors may be provided for electric, optical or acoustical measurement. Moreover, an antenna may be provided in the plasma chamber for measurement.

In cases where there are a plurality of adjustment possibilities, it is advantageous to provide the user with one or more data sets of particularly advantageous settings from which he can simply select.

The arc discharge detection device can have one or more sets of pre-set parameters that define the adjustable times and threshold values as appropriate values so that operation can be resumed rapidly. The arc discharge detection device can have memory for storing such sets of data, optionally at the instigation of the user. In These data sets can be advantageously stored in a non-volatile memory that stores the data even if the arc discharge detection device is completely disconnected from any power supply.

If a plurality of adjustment possibilities exist, there is furthermore the risk that the user will enter times or threshold values that are meaningless or that can have the result that the power supply does not work because, for example, a threshold or a blocking time is set much too low. This could have the result that no signal is available at the output because the arc discharge detection device reacts permanently to micro arc discharges and no signal would be identifiable at the output. The user can be advantageously instructed of the possible dangers with a warning message if an attempt is made to input data which are meaningless or which could be harmful for operation. Completely nonsensical settings can also be prevented.

The second threshold in particular can be set in such a manner that it can be preset by the operator as a fixed voltage or current value or in the form of a fraction of the characteristic value, that is, e.g. 10% to 90% of the set voltage, for example, 10, 25, 50, or 70% of the set voltage. When a fraction of the existing characteristic value is preset, it is possible to specify a time interval within which the actually existing characteristic value is determined and this can then be used to determine the threshold value. Alternatively or additionally, it can also be predefined whether a maximum value or an average value of the characteristic should be used over the selected time interval to determine the threshold value.

In this connection, embodiments of the arc discharge detection device can have the correspondingly suitable input, storage, warning and display means for implementing the features described above.

It can be particularly difficult to detect micro arc discharges in the case of power supplies having high residual ripple so that it can be provided to combine or correspondingly implement the detection of micro arc discharges with a so-called automatic arc discharge detection. This is achieved, in particular, within the scope of one embodiment of the method by implementing the arc discharge detection at least with respect to the second threshold value using an automatic detection method according to the disclosure of DE 10 2004 015090 A1 to which reference is hereby expressly made.

Accordingly, in a further development of the arc discharge detection device, it is provided that the arc discharge detection device is constructed at least with regard to the comparison of the electrical characteristic value in relation to the second threshold value for automatic arc discharge detection according to the disclosure of DE 10 2004 015090 A1.

One or more threshold values can be adjusted by a user or be set automatically. It is feasible, in particular, that the threshold values can be changed and thus updated. The threshold values can be adjusted, in particular, in dependence on the detected micro arc discharges or on the rate of the detected short or hard arcs. The threshold values may alternatively be variable in dependence on a signal at an input pin of the plasma current supply. In addition to automatic adjustability of the threshold values, the user can predefine a maximum or minimum threshold value which is not exceeded or fallen below, even when automatic adjustment would set a higher or smaller threshold value. Due to this measure, the threshold values can be readjusted, since the power in the plasma chamber also changes as the cathode burns off. Slow change of the voltage should also slowly change the threshold values.

The frequency of reaching one or more threshold values can also be detected. The frequency of reaching one or more threshold values corresponds to the frequency of arc occurrence. The response can be varied in dependence on the frequency of reaching a threshold value. A threshold value that is responsible for detecting micro arcs can, e.g., be adjusted with arbitrary sensitivity. This can result in that the second countermeasure is initiated more frequently. Moreover, when the frequency of micro arcs is too large, a plasma chamber cleaning program can be carried out. Alternatively or additionally, the current supply can be switched off for longer periods when micro arcs occur too often. A quasi periodic pulsing in the plasma chamber can be detected by detecting the frequency of the micro arcs. Such pulsing is not desired. For this reason, different escalation steps can be provided. An alarm can, e.g., be triggered in case of a first frequency. In case of a second frequency, a threshold value can be adjusted and in case of a third frequency, the polarity may be reversed or the current supply be switched off.

Further features and advantages are obtained from the following description of exemplary implementations of the invention with reference to the figures in the drawings, as well as from the claims. The individual features can be implemented individually by themselves or as a plurality in any combination in one variant of the invention.

Preferred exemplary implementations are shown schematically in the drawings and are explained in detail hereinafter with reference to the figures in the drawings.

DETAILED DESCRIPTION

Figure 1:
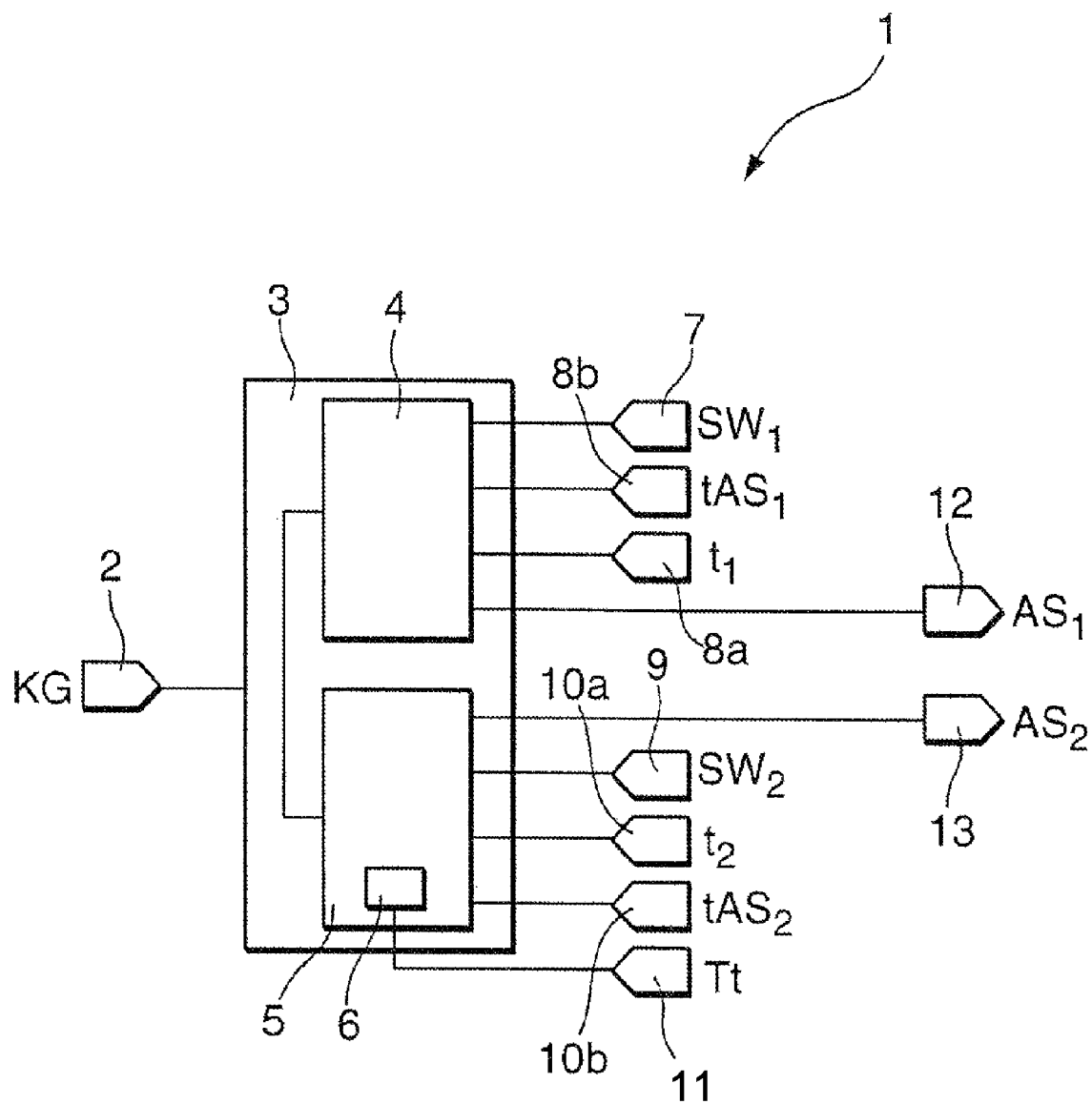
FIG. 1 is a schematic block diagram of an arc discharge detection device according to one exemplary embodiment.

FIG. 1 shows a schematic block diagram of an arc discharge detection device 1 according to one exemplary implementation. The device 1 uses at least two thresholds for detection of an arc discharge, where one threshold (a second threshold) recognizes micro arc discharges and can optionally respond to this immediately with a short pulse but can then only be triggered again after a time which can be set. This can apply even if further micro arc discharges are detected during this time. The other threshold (a first threshold) is used in a manner known per se to detect short arcs and hard arcs. The occurrence of short arcs and hard arcs can be reduced significantly with the device 1 without having a negative effect on the plasma treatment rate.

The arc discharge detection device 1 has an input 2 for a characteristic value to be monitored in the form of an electrical characteristic value or for a corresponding signal KG. Without restricting the generality, the characteristic value includes an electrical characteristic value of a plasma process (not shown) such as is used, for example, in a plasma processing or coating device. In particular, the characteristic value KG can be an electrical characteristic value of a voltage supply of the plasma process such as a corresponding voltage value or a corresponding current intensity. The characteristic value can be a current, a voltage, a voltage change in time, a current change in time, or an electric or magnetic field. The characteristic value can be detected in or downstream of an impedance matching network. The location at which the characteristic value is detected can depend, for example, on the type of characteristic value that is used. A physical value can be measured as a characteristic value in a line or using an antenna in the plasma chamber. Thus, the arc detection device 1 can include a measuring device in, upstream of, or downstream of an impedance adjustment network. Moreover, sensors can be provided for electric, optical, or acoustical measurement or an antenna can be provided in the plasma chamber for measurement of the characteristic value.

The input 2 is connected to a comparator 3 which for its part includes a first comparison means 4 and a second comparison means 5 which are connected in parallel to one another as shown in FIG. 1. The comparison means 4, 5 can be electrical circuitry having at least two inputs and at least one output and logic that determines the difference in the values of the signals at the first and second inputs. If the difference in the input signal values changes polarity, then the comparison means 4, 5 changes the value of the output (for example, from low to high or high to low, if the output is in digital form) to indicate the change in the difference between the two input signals. The electrical circuitry of the comparison means 4, 5 can include a comparator, where a first input is a fixed threshold value, and the second input is a characteristic or measured value.

The second comparison means 5 has a blocking control unit 6. Additional signal inputs 7, 8a, and 8b are provided at the first comparison means 4 and additional signal inputs 9, 10a, 10b, and 11 are provided at the second comparison means 5. A first threshold value $SW_1$ can be input through the input 7, a first delay time $t_1$ can be input through the input 8a, and a first activation time $tAS_1$ or corresponding signals can be input through the input 8b to the first comparison means 4.

A second threshold value $SW_2$ can be input through the input 9, a second delay time $t_2$ can be input through the input 10*a*, a second activation time $tAS_2$ can be input through the input 10*b*, and a blocking time Tt can be input through the input 11 to the second comparison means 5. The first comparison means 4 additionally has an output for a first control or activation signal $AS_1$, which can be output to a corresponding output 12 of the arc discharge detection device 1. Accordingly, the second comparison means 5 has an output for a second control or activation signal $AS_2$, which can be output to a corresponding output 13 of the arc discharge detection device 1.

The first and second threshold values $SW_1$ and $SW_2$ can be predefined values. The second threshold value $SW_2$ can be set in such a manner that it can be preset by the operator as a fixed voltage or current value or in the form of a fraction of the characteristic value (for example, 10% to 90% of the set voltage). One or more of the threshold values can be adjusted by a user or can be set automatically. Thus, the threshold values can be changed and updated. The threshold values can be adjusted, for example, in dependence on the detected micro arc discharges or on the rate of the detected short or hard arcs. The threshold values can alternatively be variable in dependence on a signal at an input pin of the plasma current supply. The user can predefine a maximum or a minimum threshold value that is not exceeded or fallen below, even though automatic adjustment would set a higher or a lower threshold value. And, the thresholds values can be readjusted since the power in the plasma chamber can change as the cathode burns off.

Additionally, the delay times $t_1$ or $t_2$ can be preset using the input 8*a* or the input 10*a*. The blocking time Tt can be preset or predefined through the input 11 to the blocking control unit 6, for example, at a high logic level. The blocking time can be selected to be longer than the first or second delay times, thus preventing premature switching off of the DC current supply. This ensures, for example, that more power is supplied to the plasma chamber as compared to conventional methods. Alternatively, the blocking time can be adjusted to be shorter than the first or second delay times.

The operation of the arc discharge detection device 1 of FIG. 1 is described in detail hereinafter with reference to FIG. 1 and FIG. 2.

To detect the occurrence of an arc discharge in a plasma process, a DC voltage supply of the plasma process (in the present case, also designated as a plasma DC voltage supply) can either be monitored to detect the occurrence of a voltage drop (voltage dip) or a current rise. Within the scope of the present exemplary description, however, without restricting the generality, consideration is given to the particular case in which a voltage signal of the DC voltage supply of the plasma process is used as an electrical characteristic value to identify an arc discharge. The plasma DC voltage supply by means of a voltage source (not shown in FIG. 1) is monitored for voltage drops or voltage dips. For this purpose, a corresponding signal (for example, the voltage output signal of the DC voltage supply or a signal that is proportional to the voltage output signal of the DC voltage supply) is entered into the arc discharge detection device 1 at the input 2 of the device 1. The characteristic value KG thus provided is compared in the first and second comparison means 4, 5 of the comparator 3 in each case with a corresponding predefinable threshold value $SW_1$, $SW_2$. In this case, the threshold values $SW_1$, $SW_2$ are selected in such a manner that in the event of a (discharge-induced) voltage drop of the characteristic value KG, the second threshold value $SW_2$ is reached first, i.e., the threshold value of the second comparison means 5 is reached. In other words: the second threshold value $SW_2$ is closer to a typical "arc-discharge-free (or arc-free)" plasma DC voltage than the first threshold value $SW_1$ of the first comparison means 4. This means that small, i.e., smaller-magnitude, voltage dips according to the selected threshold voltage $SW_2$ are only identified by the second comparison means 5 whereas larger-magnitude voltage drops are identified by the second comparison means 5 and also by the first comparison means 4 according to the selected first threshold voltage $SW_1$.

If the first comparison means 4 and/or the second comparison means 5 identifies a corresponding voltage drop, i.e., if the electrical characteristic value KG reaches the respective threshold value $SW_1$, $SW_2$, the respective comparison means 4, 5 outputs a corresponding activation signal $AS_1$, $AS_2$ to the respective output 12, 13. As used herein, the characteristic value reaches the respective threshold value if it is equal to or if it crosses (either drops below or exceeds) the respective threshold value. The activations signals $AS_1$, $AS_2$ then affect corresponding first and second countermeasures to suppress the arc discharge in the plasma process, where such countermeasures are known to the person skilled in the art. For example, the activation signals $AS_1$, $AS_2$ can affect a switch-off or a polarity reversal of the plasma DC voltage supply, which is not shown in detail in FIG. 1. Other possible countermeasures include delaying supply signals (for example, radio frequency signals) from the plasma DC voltage supply to the plasma chamber, switching over switching elements, reversing the polarity of the supply voltage from the plasma DC voltage supply, or counting the occurrence of arcs. The result of the comparison between the characteristic value and the threshold value can be supplied to a neural network or fuzzy logic within or external to the device 1, and the neural network or fuzzy logic can device which countermeasure to initiate.

Within the scope of the present exemplary embodiment, let the output of the first and second activation signals $AS_1$, $AS_2$ be understood in such a manner that the corresponding signals are each output as binary signals at a high logic level ("1") without the arc discharge detection device 1 being restricted to such an embodiment. Thus, the activation signals $AS_1$ and/or $AS_2$ can alternatively be output as analog signals.

The activation signals $AS_1$, $AS_2$ are not necessarily output by the first and second comparison means 4, 5 immediately after the device 1 determines that the characteristic value has reached the respective threshold value $SW_1$, $SW_2$. Rather, the activation signals $AS_1$, $AS_2$ are each output after the delay time $t_1$, $t_2$ has elapsed. In some general aspects, $t_2 \leq t_1$. Moreover, in some aspects, $t_2$, for example, can tend to or be near to zero so that the output of the second activation signal $AS_2$ takes place substantially immediately after reaching the threshold value $SW_2$.

In this way, the function of the first comparison means 4 via the first activation signal $AS_1$ can counteract more strongly defined and longer-lasting arc discharges, so-called "short arcs" or "hard arcs," whereas the second comparison means 5 on account of its function by means of the second activation signal $AS_2$ is designed to counteract short and only weakly manifest micro arc discharges, so-called "micro arcs." For this reason, as has already been mentioned, a lower value is preset for the delay time $t_2$ than for the delay time $t_1$, and the delay time $t_2$ can even tend to zero (that is, $t_2=0$). A finite (non-zero) value for the first delay time $t_1$ has the effect that in the case of self-decaying arc discharges, no corresponding countermeasure such as switching off or reversing the polarity of the voltage supply is required if the arc self decays before the time $t_1$ has lapsed.

In addition, the first countermeasure for suppressing an arc discharge effected by means of the first activation signal $AS_1$ is more strongly defined in terms of magnitude that the second countermeasure effected by the second activation signal $AS_2$. For example, the first activation signal $AS_1$ can bring about a longer-lasting switch-off or a more strongly defined polarity reversal of the voltage supply than that brought about by the second activation signal $AS_2$.

To avoid a continuously repeated output of the second activation signal $AS_2$ as a result of the position of the second threshold value $SW_2$, the already-mentioned blocking control unit 6 is provided in the second comparison means 5 of the comparator 3. The control unit 6 is activated as soon as the monitored electrical characteristic value KG reaches the threshold value $SW_2$ of the second comparison means 5, for example, as soon as the plasma DC voltage drops below the voltage level represented by the threshold value $SW_2$ in this example. From the time that the characteristic value reaches the second threshold value $SW_2$, the blocking control unit 6 outputs a blocking signal BS for a time Tt which prevents the second comparison means 5 from again emitting an activation signal $AS_2$ during the blocking time Tt. The blocking signal BS that is output by the control unit 6 can be a high logic level signal or an analog signal. In other words, even if the plasma DC voltage again and repeatedly falls below the threshold value $SW_2$ during the blocking time Tt, no further second activation signal $AS_2$ for effecting the second countermeasure is emitted before the time Tt has elapsed. The blocking signal BS output by the blocking control unit 6 accordingly cooperates with the second activation signal $AS_2$ in the manner of a logic XOR link, i.e., the second activation signal $AS_2$ cannot accept any high logic level (and accordingly effect the second countermeasure, such as temporary switching off or reversal of the polarity of the plasma DC voltage supply) if the blocking signal BS has a high logic level (and the blocking signal has a high logic level during the time interval Tt).

A plasma DC voltage supply in which the arc discharge detection device 1 can be integrated thus contains two different thresholds for identifying arc discharges. The first threshold, i.e., the first threshold value $SW_1$, is used to identify short arcs and hard arcs and reacts to these in a manner sufficiently known from the relevant prior art. The second threshold, i.e., the second threshold value $SW_2$, is set to be significantly more sensitive than the first threshold. Micro arcs are thus detected by means of the second threshold, these micro arcs having very short, mostly self-extinguishing arc discharges that have only a very weak influence on the relevant voltage or current values, i.e., on the electrical characteristic value KG. These micro arc discharges may not be detected by the arc discharge detection thresholds usually used to detect short arcs or hard arcs because the lifetime and magnitude of the micro arcs is much smaller than for short or hard arcs.

The micro arc discharges are either responded to immediately or after a preferably adjustable short delay time $t_2$ with a brief interruption or polarity reversal of the voltage at the output of the voltage supply according to the measure of the second activation signal $AS_2$. The time duration of the countermeasure thus effected to suppress the arc discharge is discussed in further detail hereinafter with reference to FIG. 2. This duration, and likewise the time duration of the first countermeasure, can be adjusted using the input 10b or 8b (at values $tAS_2$ and $tAS_1$).

There is the likewise adjustable blocking time Tt during which no renewed response is made to such a micro arc discharge. The blocking time Tt can be set at a value from zero up to values of more than several microseconds or milliseconds. It has been shown experimentally that the occurrence of short arcs and hard arcs that can develop from micro arc discharges is already reduced significantly with such an arrangement without any excessively reduced throughput of the plasma process caused by continuous interruptions in the voltage supply after micro arc discharges have been detected. In particular, in the case of plasma processes that would not develop any short arcs or hard arcs despite a cumulative occurrence of micro arc discharges, it is thus ensured that the processing rate is not excessively reduced as would be the case if the plasma DC voltage supply were not to deliver any power over large sections on account of repeated micro arc discharges because the DC voltage supply is accordingly continuously blanked out.

In plasma processes in which no micro arc discharges occur, usually no short arcs and hard arcs occur. However, should short arcs and hard arcs occur, the arc discharge detection device 1 can respond to arc discharges for short or hard arcs in the usual manner without any pulsed mode having a negative influence on the process throughput as is known from the prior art. On the other hand, in plasma processes that rarely exhibit micro arc discharges, the formation of hard arcs can be prevented or at least significantly reduced with the arc discharge detection device 1.

Figure 2:
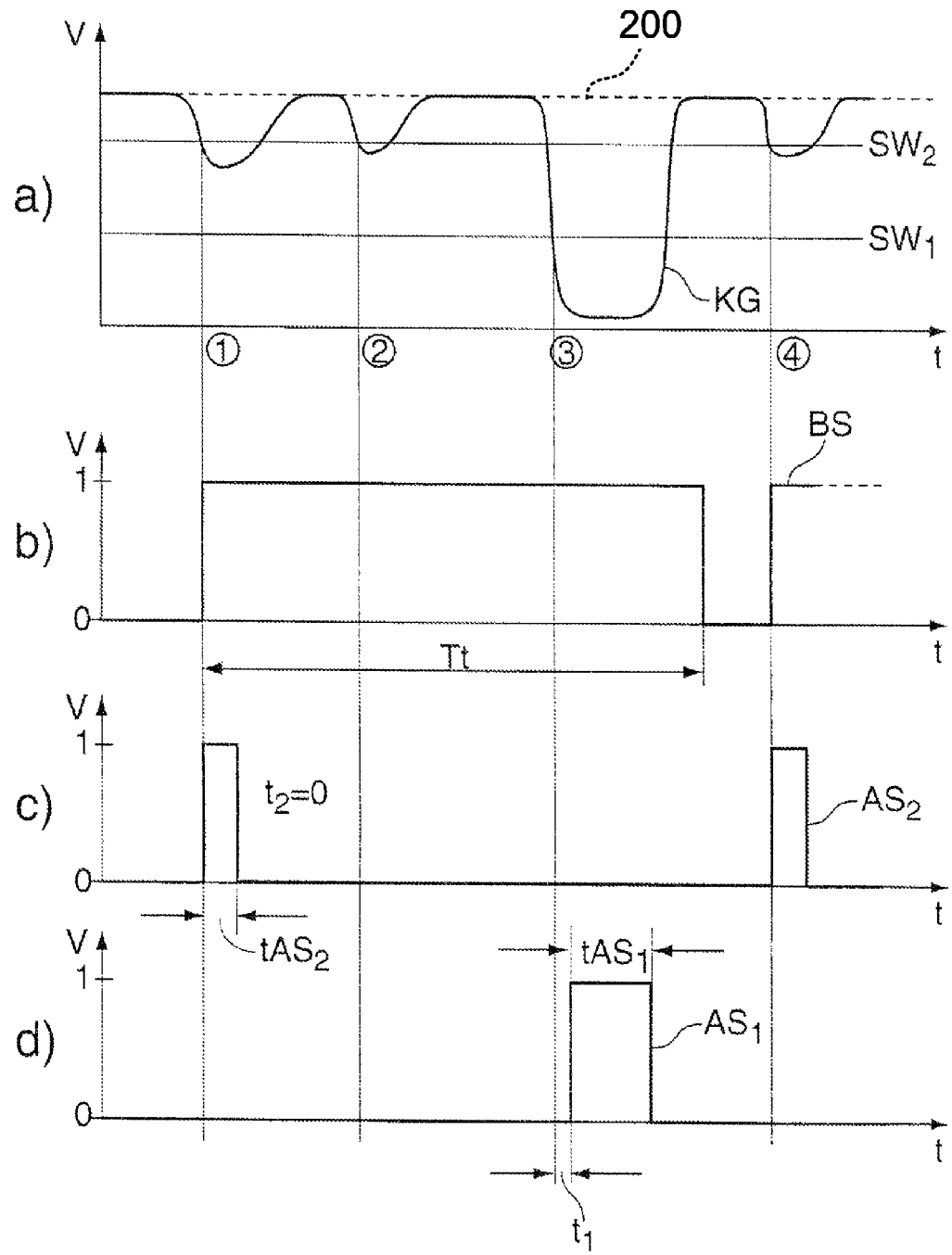
FIG. 2 is a time sequence diagram showing signal profiles during operation of the arc discharge detection device of FIG. 1.

FIG. 2 shows a time sequence diagram to illustrate signal profiles during operation of the arc discharge detection device 1 as shown in FIG. 1. The diagram according to FIG. 2 is used to explain once again the relationships that have already been described in detail with reference to FIG. 1 during operation of the arc discharge detection device 1. The upper region a) in FIG. 2 shows an exemplary time profile of the electrical characteristic value KG or a corresponding characteristic-value signal at the input 2. As discussed above, the characteristic value KG can for example, be a voltage signal. The characteristic value KG exhibits voltage drops or voltage dips at times designated by (1)-(4) in FIG. 2. In this case, the voltage drops at (1), (2) and (4) correspond to micro arc discharges (micro arcs) whereas the voltage drop at (3) indicates a short arc or a hard arc. Furthermore, the upper region a) of FIG. 2 also shows the respective position of the first and second threshold, i.e., the first threshold value $SW_1$ and the second threshold value $SW_2$, the second threshold value being closer to a typical, discharge-free signal profile 200 of the characteristic-value signal KG, where the profile 200 is indicated by a dashed horizontal line in FIG. 2. As can be seen from FIG. 2 a), the electrical characteristic value KG only falls below the threshold value $SW_2$ at the times (1), (2) and (4). However, the characteristic value also falls below the threshold value $SW_1$ at (3).

Accordingly, the blocking signal BS whose time profile is shown in FIG. 2 b) is output by the blocking control unit 6 (FIG. 1) in the form of a binary signal with states "0" and "1", where in the present case, the state "1" indicates that the blocking signal BS is active. According to the diagram in FIG. 2, the blocking signal BS is activated as soon as the electrical characteristic value KG drops below the threshold value $SW_2$ for the first time, i.e., as soon as the first micro arc discharge is detected. The blocking signal BS then remains in its active state during the blocking time Tt so that further micro arc discharges (as at (2)) are detected but no longer actively compensated. Only after the blocking signal BS has been deactivated again between (3) and (4) (BS=0), after the time Tt has elapsed, is a micro arc discharge again detected at time (4) and suppressed, as has been described in further detail above.

The circumstances described hereinbefore are shown graphically again in FIG. 2 c), which shows the state of the second activation signal $AS_2$ which, as in the case of the blocking signal BS, is a binary signal that in the present case is activated at a high logic level ("1"). Whereas following the voltage drop at (1), the second activation signal $AS_2$ is activated during the time interval $tAS_2$ and accordingly effects the second countermeasure for suppressing the detected micro arc discharge, at (2), in particular, no activation of the second activation signal $AS_2$ takes place since the blocking signal BS has a high logic level (BS=1). According to the above description, the second activation signal $AS_2$ is only activated during the time interval $tAS_2$ at (4) after the time Tt has elapsed. Naturally, the blocking signal BS is not generated again by detecting another micro arc discharge at time (2), i.e., no retriggering takes place.

It should be noted that according to the diagram in FIG. 2 *c*), the delay time $t_2$ for the activation of the second activation signal $AS_2$, i.e., for taking the second countermeasure is $t_2=0$. In other words, the second activation signal $AS_2$ is activated immediately after detecting a micro arc discharge. Alternatively hereto however, a finite and non-zero delay time $t_2$ can be provided between the respective detection time and the activation of the second activation signal $AS_2$ if this is desirable for a particular plasma process.

It should further be noted that according to the diagram in FIG. 2 *b*), the blocking time Tt runs independently of whether a hard or short arc is detected in the relevant time. However, it is alternatively also possible that the blocking signal BS is deactivated every time a hard or short arc is detected. This can be particularly appropriate for very long blocking times or when the blocking time is set automatically since a hard or short arc constitutes a particular event in the plasma.

Finally, FIG. 2 *d*) shows the state of the first activation signal $AS_1$, likewise being a binary signal that is activated at a high logic level ("1"). According to the diagram, the first activation signal $AS_1$ is activated for a time $tAS_1$ after a delay interval or a delay time $t_1$ has elapsed following a defined voltage dip at (3) to bring about the first countermeasure for suppressing the arc discharge in accordance with the explanations put forward above. Since this accordingly is a short arc or a hard arc, the first activation signal $AS_1$ is activated for a longer time duration compared to the activation of the second activation signal $AS_2$, i.e., $tAS_1 \geq tAS_2$. In this case, advantageous values for $tAS_2$ lie between about 1 µs and about 20 µs, and can be, for example, less than one microsecond.

An advantageous two-stage response according to the design of the arc discharge detection device 1 to the occurrence of an arc discharge can take place in a case other than that shown as an example in FIG. 2 when a short arc or a hard arc occurs. This is then the case if a significant voltage drop occurs in a state BS=0, as identified at (3) so that initially on account of $t_2 \leq t_1$, the second countermeasure is taken, for example, switching off the plasma DC voltage supply and then the usually stronger first countermeasure is taken, for example, a longer interruption of the plasma DC voltage supply. Such a graded response behavior of the arc discharge detection device 1 or a plasma DC voltage supply using such a device can particularly contribute towards avoiding arc discharges in plasma processes.

The triggering of the second countermeasure frequently has the result that the second threshold is fallen below. For this reason, another embodiment advantageously provides the possibility of suppressing the detection of hard arcs and short arcs by means of the first threshold for the duration of the effectiveness of the second countermeasure. By means of corresponding settings it can then be ensured that a hard arc or a short arc is reliably detected after the second countermeasure has been carried out. Since such a method can result in errors, it is advantageous in the course of the aforementioned further developments to provide a second delay time $t_2>0$ during which no response is (yet) made to the detected micro discharge. During this time it is possible for the arc discharge recognition to detect that the first threshold is reached to identify a short arc or hard arc and take the corresponding first countermeasure.

Figure 3:
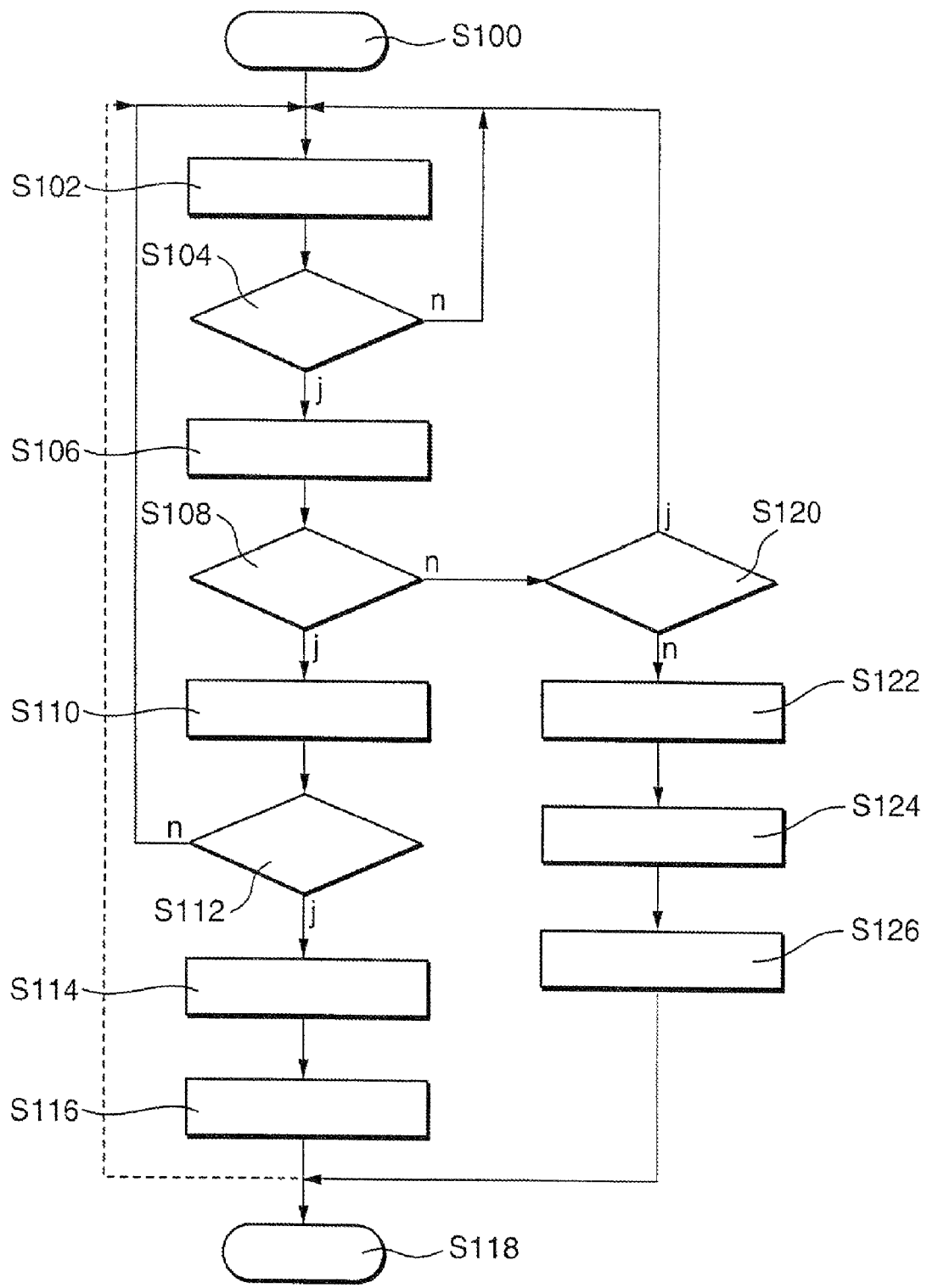
FIG. 3 is a flow chart of a procedure performed during operation of the arc discharge detection device of FIG. 1.

FIG. 3 shows a flow diagram to illustrate an exemplary embodiment of the method according to the invention. With reference to the diagram in FIG. 3, the sequences resulting from the processes that have already been explained with reference to FIGS. 1 and 2 during operation of the arc discharge detection device 1 are summarized again.

The method as shown in the exemplary diagram in FIG. 3 begins at step S1100. The device 1 monitors the characteristic value in this case in particular an electrical characteristic value, for example, a voltage signal of the plasma DC voltage supply (step S102).

The device 1 determines whether the characteristic value reaches the second threshold value (which lies closer to a typical "normal state" of the electrical characteristic value) (step S104). If the device 1 determines that the characteristic value has not reached the second threshold value (step S104), the device 1 continues to monitor the electrical characteristic value (step S102).

If the device 1 determines that the characteristic value has reached the second threshold value (step S104), the device 1 waits for the second delay time $t_2$ associated with the monitoring of the second threshold value to elapse (step S106). Next, the device 1 determines whether the electrical characteristic value has reached the (more remote) first threshold value (step S108). If the device 1 determines that the characteristic value has reached the first threshold value (step S108), then the device 1 assesses this determination as an indication of the presence of a short arc or a hard arc. Accordingly, the device 1 waits for the first delay time $t_1$ before taking any action to determine whether the voltage recovers by itself (for example, as could happen for a self-extinguishing short arc) or whether this is a hard arc that can result in complete destruction of the plasma without suitable countermeasures (step S110). After the first delay time has elapsed, the device 1 determines whether the characteristic value is still below the first threshold value (step S12). If the characteristic value is still below the first threshold value (step S12), the device 1 activates the first activation signal (step S114), as described in detail above, so that the first countermeasure for suppressing the detected arc discharge can then be taken in step S16. The method then ends with step S118. Alternatively (dashed line in FIG. 3), the device 1 can continue the method (repeated) at step S102.

If the characteristic value in step S112 is no longer below the first threshold, the method likewise returns to step S102 without any interruption of the process (self-extinguishing short arc).

If the check in step S108 is negative (n), i.e., the characteristic value is below the second threshold but not below the first threshold, the device 1 determines whether the blocking signal BS (see FIG. 2 *b*)) is active or not (step S120). If the blocking signal is active (j), the device 1 does not activate the second activation signal and the method returns to step S102. Otherwise (n), the device 1 activates the second activation signal (step S122), and activates the blocking signal BS for a corresponding time interval (see above) (step S124). The second countermeasure for suppressing the detected micro arc discharge is then taken in step S126 whereupon the method either ends with step S118 or (dashed line in FIG. 3) returns to step S102.

Figure 4:
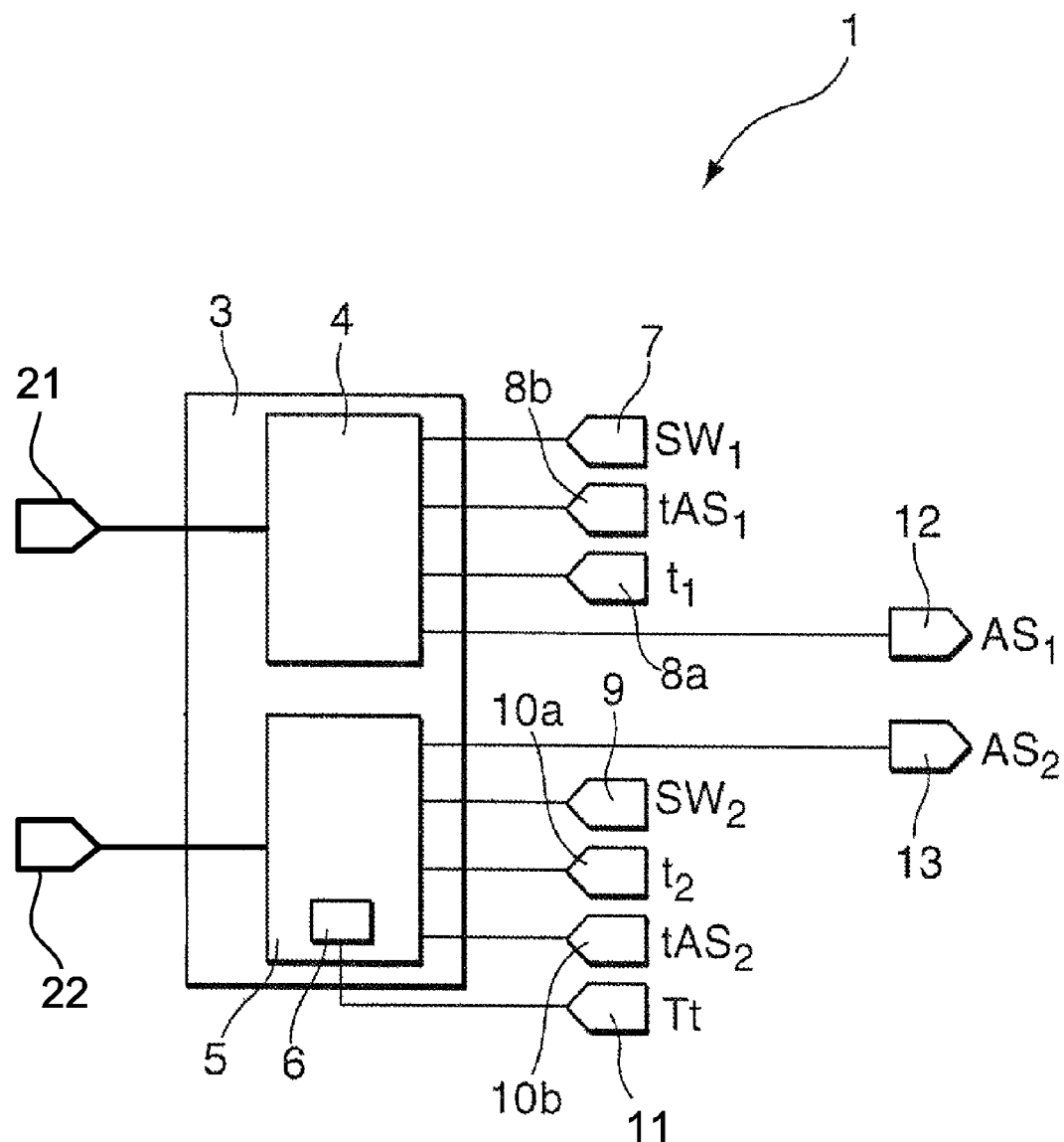
FIG. 4 is a schematic block diagram of an arc discharge detection device according to another exemplary embodiment.

Referring to FIG. 4, for example, in another implementation, different characteristic values 21 and 22 can be compared with each of the respective threshold values $SW_1$ and SW$_2$. Thus, for example, a first characteristic value (for example, an output current of the DC voltage supply) can be compared with the first threshold value SW$_1$ to determine if a hard or short arc is present, and a second characteristic value (for example, an output voltage of the DC voltage supply) can be compared with the second threshold value SW$_2$ to determine if a micro arc is present.

As another implementation, two or more characteristic values can be compared with one or more of the threshold values. For example, the characteristic value 21 can be input to both the comparison means 4 and 5 and the device 1 can compare the characteristic value 21 with both threshold values SW$_1$ and SW$_2$.

Figure 5:
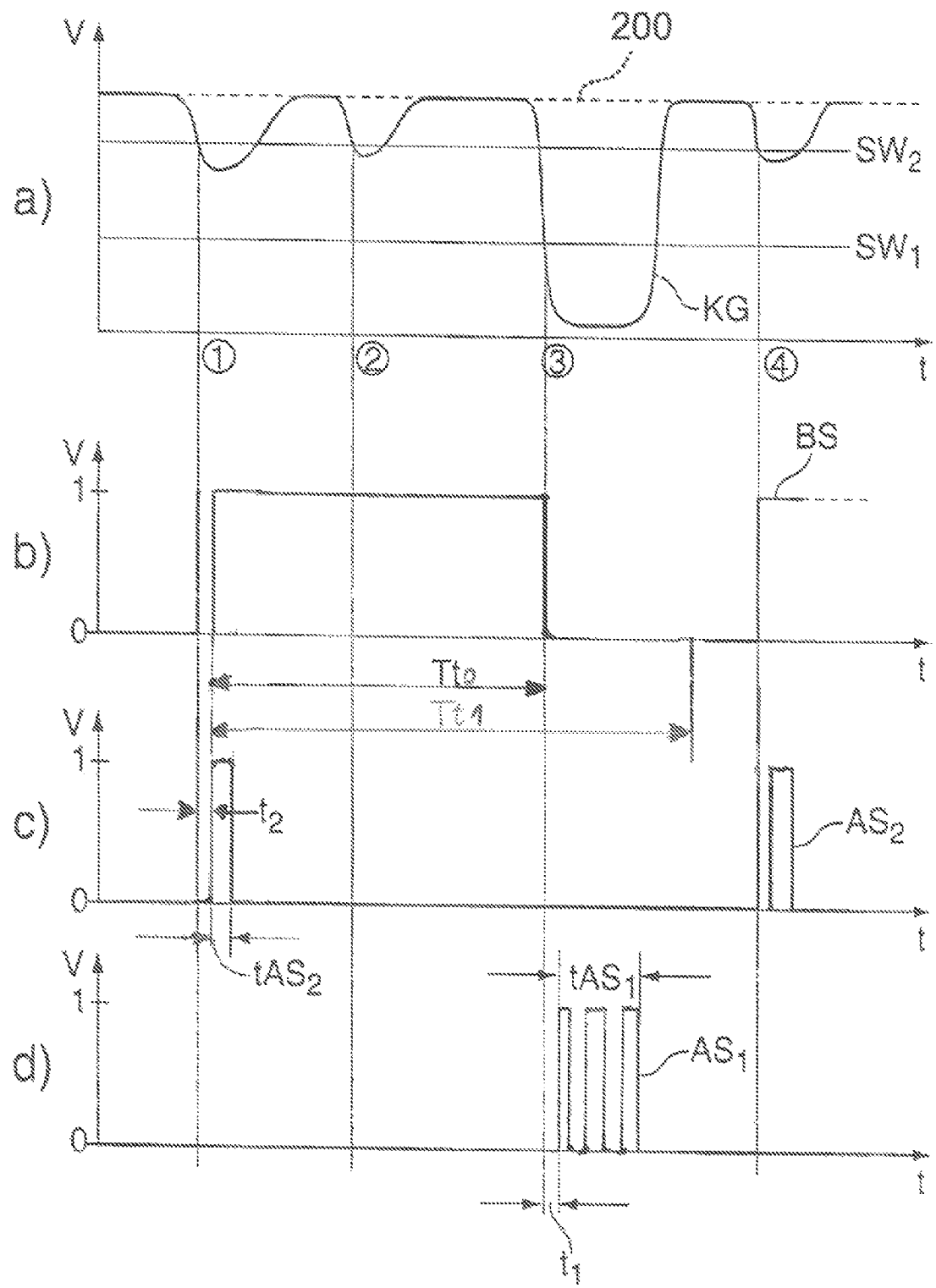
FIG. 5 is another implementation of a time sequence diagram showing signal profiles during operation of the arc discharge detection device of FIG. 1.

Referring to FIG. 5, a time sequence diagram similar to the one of FIG. 2 is shown. In FIG. 5 c), the delay time t$_2$ is not zero, so the effect of t$_2$ can be seen. Furthermore, the blocking signal BS in FIG. 5 b) does not start immediately after the second threshold value SW$_2$ is reached but starts at the beginning of the high period (rising flank) of the second activation signal AS$_2$. The blocking signal BS can be started at any time between the time (1) and the end of the high state (the falling flank) of the signal AS$_1$. Furthermore, the blocking signal BS is deactivated with the detection of a hard or a short arc at time (3). So, the configured blocking time Tt is, in this case, shortened to Tt$_0$. Additionally, the signal AS$_1$ in FIG. 5 d) is activated after the detection of a short or a hard arc at time (3) and after a time delay t$_1$ in a so called pulse burst mode, which means for the time tAS$_1$, the signal AS$_1$ is activated several times to generate a burst of short pulses to decay the arc effectively. The pulse burst mode can also (or alternatively) be done with the signal AS$_2$ in a similar manner.

The characteristic value can be supplied to an extreme value detection device for detecting an extreme value of the characteristic value as a second threshold value in a predefined time period. An adjusting means generates a reference signal from the extreme value, which is supplied to the comparator as well as an instantaneous value of the characteristic value or of a proportional signal. The comparator changes the signal level of the arc discharge detection signal when the comparator detects that the instantaneous value has reached the reference signal. The extreme value detection device is described, for example, in U.S. application Ser. No. 11/534,240, which is incorporated herein by reference in its entirety.

In other implementations, the arc discharge detection device 1 can be set up to receive additional thresholds or threshold values (such as SW$_3$ and SW$_4$) for detecting submicro arcs to which a similar response can be made as to the micro arc discharges described above. Additionally, another blocking time (BT') can be provided for these submicro arcs and the other blocking time BT' can be set independently of the micro arc discharges. If we introduce, e.g., a third threshold value SW$_3$ then the third threshold value SW$_3$ can be even more sensitive or even closer to the "discharge-free signal profile" 200 than the second threshold value SW$_2$. With the third threshold value SW$_3$ it is therefore possible to detect arcs that are so "submicro" that even the micro arc detection is not able to detect them.

OTHER EMBODIMENTS

While the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A method for detection of an arc discharge in a plasma process, the method comprising:
   detecting arc discharges by monitoring one or more characteristic values of the plasma process,
   comparing at least a first characteristic value with a first threshold value (SW$_1$),
   recognizing a potential arc discharge when it is determined that the at least first characteristic value reaches the first threshold value and triggering a first countermeasure to suppress the arc discharge,
   comparing at least a second characteristic value with a second threshold value (SW$_2$) that differs from the first threshold value,
   triggering a second countermeasure for suppressing the arc discharge when it is determined that the second characteristic value reaches the second threshold value, and
   after the second countermeasure has been triggered, preventing a renewed triggering of the second countermeasure during a blocking time (Tt).

2. The method of claim 1, wherein the second threshold value is reached before the first threshold value is reached when the second characteristic value deviates from a discharge-free operating value.

3. The method of claim 1, further comprising setting the blocking time (Tt).

4. The method of claim 1, further comprising automatically setting the blocking time (Tt).

5. The method of claim 1, further comprising automatically varying the blocking time (Tt) depending on a number of micro arc discharges that have occurred within a predetermined time.

6. The method of claim 1, wherein one or more characteristic values are compared with more than two threshold values, and when the respective threshold values are exceeded, different and respective countermeasures are taken.

7. The method of claim 1, wherein triggering the first countermeasure includes interrupting a plasma voltage supply or reversing the polarity of the plasma voltage supply during a first time (tAS$_1$) that can be set.

8. The method of claim 7, wherein triggering the second countermeasure includes interrupting a plasma voltage supply or reversing the polarity of the plasma voltage supply during a second time (tAS$_2$) that can be set.

9. The method of claim 8, wherein the second time (tAS$_2$) is shorter than the first time (tAS$_1$).

10. The method of claim 8, wherein the second time tAS$_2$ is greater than or equal to a time t$_0$ and is less than or equal to 20 μs, wherein the time t$_0$ is less than or equal to 1 μs.

11. The method of claim 8, wherein the blocking time (Tt) is longer than the first time (tAS$_1$) or the second time (tAS$_2$).

12. The method of claim 1, wherein the second countermeasure is triggered immediately on reaching the second threshold value (SW$_2$).

13. The method of claim 1, wherein the first countermeasure is triggered after an adjustable first delay time (t$_1$) after reaching the first threshold value (SW$_1$).

14. The method of claim 1, wherein when the second threshold value (SW$_2$) is reached, there is no comparison with the first threshold value or the result of the comparison is ignored for a predefinable time.

15. The method of claim 1, further comprising after an adjustable delay time (t$_1$) after reaching the first threshold value (SW$_2$), determining whether the first threshold value (SW$_1$) is still reached, and triggering the first countermeasure only if the first threshold value SW$_1$ is still reached.

16. The method of claim 1, wherein the second countermeasure is triggered after an adjustable second delay time ($t_2$) after reaching the second threshold value ($SW_2$).

17. The method of claim 1, wherein the blocking time (Tt) is set at a value between a first value and a second value of the order of magnitude of several microseconds or milliseconds.

18. The method of claim 17, wherein the blocking time is greater than or equal to 0.

19. The method of claim 1, wherein the blocking time (Tt) is set to a value that is larger than the duration of the second countermeasure.

20. The method of claim 1, wherein monitoring one or more characteristic values of the plasma process includes monitoring at least one characteristic value upstream of, in, or downstream of an impedance matching network.

21. The method of claim 1, wherein the second characteristic value equals the first characteristic value.

22. The method of claim 1, wherein the second characteristic value is distinct from the first characteristic value.

23. The method of claim 1, wherein comparing the second characteristic value with the pre-definable second threshold value includes comparing an instantaneous value of the second characteristic value with a value determined from the second characteristic value within a predetermined time period, wherein an extreme value of the second characteristic value in the predetermined time period is determined as the second threshold value ($SW_2$) and arc discharge is detected based on the comparison.

24. The method of claim 23, wherein the arc discharge is detected when the comparison shows that the deviation of the instantaneous value or a value proportional thereto from the extreme value exceeds a pre-definable deviation.

25. The method of claim 23, wherein the arc discharge is detected when the instantaneous value or the value proportional thereto reach a reference value that can be determined from the predefinable deviation.

26. The method of claim 1, wherein one or more threshold values are configured to be adjusted by a user or to be set automatically.

27. The method of claim 1, further comprising detecting the frequency of reaching one or more threshold values.

28. The method of claim 1, wherein the first threshold value is pre-defined.

29. The method of claim 1, wherein the second threshold value is pre-defined.

30. An arc discharge detection device for detection of arc discharges in a plasma process, the device comprising:
a first comparison apparatus that compares a first characteristic value of the plasma process with a first threshold value ($SW_1$), wherein on reaching the first threshold value, the first comparison apparatus triggers a first countermeasure for suppressing the arc discharge by activating a first control signal ($AS_1$),
a second comparison apparatus that compares a second characteristic value with a second threshold value ($SW_2$), wherein the second threshold value differs from the first threshold value and wherein, on reaching the second threshold value, the second comparison apparatus triggers a second countermeasure for arc discharge suppression by activating a second control signal ($AS_2$), and
a blocking control unit that blocks renewed activation of the second control signal during a blocking time (Tt) after activation of the second control signal.

31. The arc discharge detection device of claim 30, wherein the second characteristic value equals the first characteristic value.

32. The arc discharge detection device of claim 31, wherein the second threshold value is reached first when the characteristic value deviates from a discharge-free operating value.

33. The arc discharge detection device of claim 30, wherein the second characteristic value is distinct from the first characteristic value.

34. The arc discharge detection device of claim 32, wherein the second threshold value is reached first when the second characteristic value deviates from a discharge-free operating value.

35. The arc discharge detection device of claim 30, wherein the one or more of the first and second characteristic values include one or more of an output voltage, an output current, electric or magnetic fields, and temporal changes of physical quantities of a plasma voltage supply.

36. The arc discharge detection device of claim 30, wherein the first and second threshold values are threshold voltages, threshold currents, or threshold fields or values representative of changes of physical quantities.

37. The arc discharge detection device of claim 30, wherein one or more of the countermeasures includes switching off or reversing a polarity of a plasma voltage supply according to the first and/or second control signal ($AS_1$, $AS_2$) or switching off a plasma voltage supply.

38. The arc discharge detection device of claim 30, wherein the first and/or the second countermeasure can be triggered after corresponding adjustable delay times ($t_1$, $t_2$) for the first control signal ($AS_1$) or for the second control signal ($AS_2$).

39. The arc discharge detection device of claim 38, wherein for a respective time duration of the first and second countermeasures ($tAS_1$, $tAS_2$) the time duration of the second countermeasure ($tAS_2$) is shorter than the time duration of the first countermeasure ($tAS_1$).

40. The arc discharge detection device of claim 38, wherein the time duration of the second countermeasure ($tAS_2$) is less than about one microsecond and up to about 20 μs.

41. The arc discharge detection device of claim 30, wherein the blocking time (Tt) is freely adjustable.

42. The arc discharge detection device of claim 30, wherein the blocking time (Tt) is configured to be set automatically.

43. The arc discharge detection device of claim 30, wherein the blocking time (Tt) is configured to be varied automatically depending on a number of micro arc discharges that have occurred.

44. The arc discharge detection device of claim 30, wherein the blocking time (Tt) is between about zero and about several microseconds or milliseconds.

45. The arc discharge detection device of claim 30, wherein the arc discharge detection device is designed at least with regard to the comparison of the second characteristic value in relation to the second threshold value ($SW_2$) for automatic detection of an arc discharge as an arc discharge detection device for detecting arc discharges in a plasma process, to which a second characteristic value is supplied and which includes a comparator that emits an arc discharge detection signal and includes the first comparison apparatus and the second comparison apparatus, wherein the second characteristic value is supplied to an extreme value detection device for detecting an extreme value of the second characteristic value as a second threshold value in a predefined time period, wherein an adjusting means generates a reference signal from the extreme value, which is supplied to the comparator as well as an instantaneous value of the second characteristic value or of a proportional signal, wherein the comparator changes the signal level of the arc discharge detection signal when the comparator detects that the instantaneous value has reached the reference signal.

* * * * *

UNITED STATES PATENT AND TRADEMARK OFFICE
CERTIFICATE OF CORRECTION

PATENT NO. : 7,995,313 B2  Page 1 of 1
APPLICATION NO. : 11/944556
DATED : August 9, 2011
INVENTOR(S) : Moritz Nitschke It is certified that error appears in the above-identified patent and that said Letters Patent is hereby corrected as shown below:

Column 18, In Claim 10, line 50, delete "to" and insert --$t_0$--.

Signed and Sealed this
Fourth Day of October, 2011

David J. Kappos
*Director of the United States Patent and Trademark Office*